(12) United States Patent
Piret

(10) Patent No.: US 6,910,006 B2
(45) Date of Patent: Jun. 21, 2005

(54) DECODING METHOD AND DEVICE AND SYSTEMS IMPLEMENTING THEM

(75) Inventor: Philippe Piret, Cesson-Sevigne (FR)

(73) Assignee: Canon Kabushiki Kaisha, Tokyo (JP)

(*) Notice: Subject to any disclaimer, the term of this patent is extended or adjusted under 35 U.S.C. 154(b) by 331 days.

(21) Appl. No.: 09/892,874

(22) Filed: Jun. 28, 2001

(65) Prior Publication Data

US 2002/0016713 A1 Feb. 7, 2002

(30) Foreign Application Priority Data

Jun. 28, 2000 (FR) .............................. 00 08313

(51) Int. Cl.[7] .............................................. G10L 19/02

(52) U.S. Cl. ....................... 704/203; 704/201; 714/780; 714/794

(58) Field of Search ................................ 714/780, 794, 714/781, 791, 800; 341/82, 107; 704/201, 240, 270, 203, 204

(56) References Cited

U.S. PATENT DOCUMENTS

| | | | | |
|---|---|---|---|---|
| 6,484,283 | B2 * | 11/2002 | Stephen et al. ............. | 714/786 |
| 6,499,128 | B1 * | 12/2002 | Gerlach et al. ............. | 714/755 |
| 6,510,536 | B1 * | 1/2003 | Crozier et al. ............. | 714/755 |
| 6,578,170 | B1 * | 6/2003 | Piret et al. ................. | 714/758 |
| 6,594,792 | B1 * | 7/2003 | Hladik et al. .............. | 714/755 |
| 6,606,725 | B1 * | 8/2003 | Wang et al. ................ | 714/755 |
| 2003/0101407 | A1 * | 5/2003 | Ariel et al. ................. | 714/774 |

FOREIGN PATENT DOCUMENTS

DE WO-000169789 A2 * 9/2001

OTHER PUBLICATIONS

Ghrayeb, Ali; Ryan, W., "Performance of High Rate Turbo Codes Employing the Soft–Output Viterbi Algorithm", Signals, Systems, and Computers, Oct. 1999. vol.: 2, 24–27.*

Papke, L.; Robertson, P.; Villebrun, E., "Improved Decoding with the SOVA in a Parallel Concatenated (Turbo–code) Scheme" Converging Technologies for Tomorrow's Applications. 1996 IEEE International Conference on , vol.: 1 , 23–27, Jun. 1996.*

R.E. Blahut, "*Theory and Practice of Error Control Codes,*" ADDISON–WESLEY, U.S. pp. 176–191 (May 1984), XP002163579.

(Continued)

*Primary Examiner*—W. R. Young
*Assistant Examiner*—James S. Wozniak
(74) *Attorney, Agent, or Firm*—Fitzpatrick, Cella, Harper & Scinto

(57) ABSTRACT

In order to decode a sequence $\alpha=(\alpha_1, \ldots, \alpha_i, \ldots, \alpha_n)$ where $\alpha_i$ is the received electrical signal corresponding to a transmitted signal $a_i$ representing the $i^{th}$ binary element $v_i$ of a word $v=(v_1, \ldots, v_n)$ chosen in a code C of words satisfying $v \cdot h^T = 0$, where h is a row n-tuplet on the set $\{0,1\}$, whose number of 1 is denoted w, an item of extrinsic information $\rho_{ext}[A(i,h)] = P[a_i = -1 | A(i,h)]/P[a_i = +1 | A(i,h)]$ is determined on each of the elements $v_i$ covered by h, $A(i,h)$ being the set of the received values $\alpha_j$ covered by h, with the exception of $\alpha_i$, and $P[a_i | A(i,h)]$ being the probability that the $i^{th}$ signal transmitted was $a_i$. This gives $\rho_{ext}[A(i,h)] = [S_1(i) + S_3(i) + \ldots]/[1 + S_2(i) + S_4(i) + \ldots]$ where the numbers $S_r(i)$ are calculated by applying the recurrence $$r^{-1} \sum_{i=1}^{w} z^{\alpha_i} S_{r-1}(i) - z^{\alpha_j} S_{r-1}(j) = S_r(j)$$

to the numbers $S_0(i)$ initialised to 1, with $z = \exp(-4 \, E/N)$, where E is the energy of the transmitted signals $a_i$ and N is the spectral power density of the noise on the transmission channel.

24 Claims, 6 Drawing Sheets

OTHER PUBLICATIONS

C. Barel, *"Etude d'un code correctuer d'errors pour un système de télémesure,"* (public presentation and corresponding paper), Bruz, pp. 40–48 (Jun. 1994), XP002163578.

R.M. Pyndiah, *"Near–Optimum Decoding of Product Codes: Block Turbo Codes,"* IEEE Translations On Communications, IEEE Inc., New York, U.S., vol. 46, No. 8, pp. 1003–1010 (Aug. 1, 1998), XP000782280, ISBN: 0090–6778.

* cited by examiner

DECODING METHOD AND DEVICE AND SYSTEMS IMPLEMENTING THEM

FIELD OF THE INVENTION

The present invention relates to a decoding method and device and to systems using them.

BACKGROUND OF THE INVENTION

The situation is considered where a set of information to be transmitted is represented by a sequence of symbols belonging to the set {0,1}. This set is referred to as the binary alphabet and its elements are referred to as binary elements or bits.

In order to transmit these binary elements, they are converted into electrical quantities. For example, the bit 0 is represented by a positive electrical signal and the bit 1 by a negative electrical signal. These electrical signals have the same absolute value, which is here arbitrarily chosen so as to be equal to 1 in order to simplify the description. However, in reality, these signals can take any value deemed appropriate according to the envisaged application, such as, for example, an electrical voltage of ±5 volts.

When these electrical signals are transmitted over a transmission channel impaired by noise, the received values differ from the transmitted values.

In particular, if the transmission channel is impaired by a white Gaussian noise, the received value a corresponding to a transmitted symbol a belonging to the set {−1,+1} is a random variable whose probability density is given by $p(\alpha|a)=(\sigma\sqrt{2\pi})^{-1}\exp[-(a-\alpha)^2/2\sigma^2]$, where the parameter $\sigma$ is specified by the signal to noise ratio of the transmission channel: $\sigma=\sqrt{N/2E}$ where N is the spectral power density of the noise and E is the energy of the signal transmitted.

The probability that the symbol a has been transmitted, if $\alpha$ is the symbol received, is denoted $P(a|\alpha)$. The value of $\rho(\alpha)=P(-1|\alpha)/P(+1|\alpha)$ can be used to obtain an estimation â of the transmitted symbol a, received in the form of $\alpha$: if $\rho(\alpha)>1$ then â is chosen so as to be equal to −1 and if $\rho(\alpha)<1$ then â is chosen so as to be equal to +1.

For the purpose of limiting the effect of the noise on the efficacy of the transmission of information, it is known that an error correcting encoding can be implemented, which consists of using only a small proportion of all the possible sequences for representing the information.

An example of such an error correcting encoding is block linear encoding: the binary sequence to be transmitted is a sequence of words of n binary elements, n being a positive integer, each of these words being chosen in the subset C of the words v of length n which satisfy $v \cdot H^T=0$, where H is a matrix of dimension (n−k)×n on the set {0,1}, 0 is the (n−k)-tuplet of zeros and $^T$ represents the transposition, k being an integer less than n. In addition, the components of the matrix product $v \cdot H^T$ are calculated modulo 2.

It is well known to a person skilled in the art that any word v of the code C satisfies $v \cdot h^T=0$ for any binary n-tuplet h which is the result of a linear combination of the rows of the matrix H. It should be noted that, in this context, the expression "linear combination" implies that the coefficients which define it are themselves binary elements and the result is always to be reduced modulo 2.

The set of words h thus obtained is referred to as the orthogonal code or dual of the code C and is generally denoted $C^\perp$. Let us consider a word h of $C^\perp$ whose weight is w (w being an integer less than n), which means that it contains w binary elements equal to 1 and n−w binary elements equal to 0.

Assume, in order to simplify, that these w binary elements equal to 1 appear in the first w positions of h: $h=(1, \ldots, 1, 0, \ldots, 0)$. Let $v=(v_1, \ldots, v_n)$. The equation $v \cdot h^T=0$ therefore means $$\sum_{i=1}^{w} v_i = 0$$

modulo 2. It implies in particular:

$$v_1=v_2+v_3+\ldots+v_w \text{ modulo } 2 \quad (1)$$

and, more generally, $$v_i=v_1+\ldots+v_{i-1}+v_{i+1}+\ldots+v_w \text{ modulo } 2 \quad (2)$$

for any integer i between 1 and w.

Let $a=(a_1, \ldots, a_n)$ be the sequence of electrical signals transmitted belonging, in order to simplify, to {−1,+1} and representing the binary n-tuplet v. Let $\alpha=(\alpha_1, \ldots, \alpha_n)$ be the corresponding received sequence. Equations (1) and (2) above show that, given h, there are, for each of the first w binary values $v_i$, two independent items of information which can be extracted from $\alpha$. The first is the received value $\alpha_i$, from which it is possible to calculate $\rho(\alpha_i)$ as explained above. The second is the set, denoted $A(i,h)$, of the values $\alpha_j$, $j=1, \ldots, i-1, i+1, \ldots, w$. This is because, for any i, the values $\alpha_j$ of $A(i,h)$ are a noisy image of the corresponding symbols $a_j$, which are a faithful translation of the corresponding binary elements $v_j$.

In order to explain this second item of information, said to be extrinsic, on $v_i$, the quantity $z=\exp(-2/\sigma^2)=\exp(-4E/N)$ is introduced, which depends on the signal to noise ratio of the transmission channel in question, and there are defined:

$S_1(i)=\Sigma z^{\alpha_j}, \alpha_j \in A(i,h),$ $S_2(i)=\Sigma z^{\alpha_j+\alpha_k}, \alpha_j, \alpha_k \in A(i,h), j<k,$ $S_3(i)=\Sigma z^{\alpha_j+\alpha_k+\alpha_l}, \alpha_j, \alpha_k, \alpha_l \in A(i,h), j<k<l, \ldots$ $S_{w-1}(i)=z^{\alpha_1+\ldots+\alpha_{i-1}+\alpha_{i+1}+\ldots+\alpha_w}$ $P[a_i|A(i,h)]$ is defined as being the probability that the $i^{th}$ signal transmitted was $a_i$ given the symbols $\alpha_j$ of $A(i,h)$. The quantity $\rho_{ext}[A(i,h)]=P[a_i=-1|A(i,h)]/P[a_i=+1|A(i,h)]$ supplies "additional information" on the value of the transmitted symbol $a_i$.

It can be shown that the quantities $\rho_{ext}[A(i,h)]$ have a very simple expression according to the polynomials $S_r(i)$ introduced above:

$\rho_{ext}[A(i,h)]=[S_1(i)+S_3(i)+\ldots]/[1+S_2(i)+S_4(i)+\ldots]$

When methods of the probabilistic type are used for estimating what was the transmitted sequence (or only some of its binary elements), the following problem is posed: it is sought to determine the quantities $\rho_{ext}[A(i,h)]$ for $i=1, \ldots, w$ with a calculation cost as low as possible, on the basis of the w binary elements received represented by the received signals $\alpha_j$, corresponding to a word h of the code $C^\perp$.

SUMMARY OF THE INVENTION

The purpose of the present invention is to afford a solution to the aforementioned problem.

To this end, the present invention proposes a method of decoding a received sequence $\alpha=(\alpha_1, \ldots, \alpha_n)$ where, for any integer i between 1 and n, n being an integer greater than 1, $\alpha_i$ is the received electrical signal corresponding to the transmission of an electrical signal $a_i$ representing the $i^{th}$ binary element $v_i$ of a word chosen in a binary code C of words $v=(v_1, \ldots, v_n)$ satisfying $v \cdot h^T=0$, where h is a row n-tuplet on the set $\{0,1\}$ whose number of 1 is denoted w, where $^T$ represents the transposition and the scalar product $v \cdot h^T$ is calculated modulo 2, this decoding method including a step consisting of determining extrinsic information on each of the binary elements of v covered by h, the extrinsic information given on the $i^{th}$ binary element of v, assumed to be covered by h, being the quantity $\rho_{ext}[A(i,h)]=P[a_i=-1|A(i,h)]/P[a_i=+1|A(i,h)]$, where A(i,h) is the set of received values $\alpha_j$ of $\alpha$ which are covered by h, with the exception of $\alpha_i$, and where $P[a_i|A(i,h)]$ is the probability, calculated on the basis of the received signals $\alpha_j$ of A(i,h), that the $i^{th}$ signal transmitted was $a_i$, this decoding method being remarkable in that the determination of the extrinsic information is effected by means of the formula $$\rho_{ext}[A(i,h)]=[S_1(i)+S_3(i)+ \ldots ]/[1+S_2(i)+S_4(i)+ \ldots ]$$

where the numbers $S_r(i)$, for any integer r between 1 and w−1, are calculated by applying the recurrence $$r^{-1}\sum_{i=1}^{w} z^{\alpha_i}S_{r-1}(i) - z^{\alpha_j}S_{r-1}(j) = S_r(j)$$

to the numbers $S_0(i)$ initialised to 1, with $z=\exp(-4E/N)$, where E is the energy of the transmitted signal $a_i$ and N is the spectral power density of the noise on the transmission channel.

It is said that the word h covers the index position i (of v, a or $\alpha$) if the binary element of h in position i is 1.

The present invention thus makes it possible to simplify the calculation of the quantities $\rho_{ext}[A(i,h)]$, which can thus be effected in a number of steps which can be expressed in polynomial form according to the weight w of h.

According to a particular characteristic, a supplementary item of extrinsic information is determined on each of the binary elements of v covered by h by applying the recurrence $$r^{-1}\sum_{i=1}^{w} \rho(\alpha_i)S_{r-1}(i) - \rho(\alpha_j)S_{r-1}(j) = S_r(j)$$

where $\rho(\alpha_i)$ represents the ratio between the probability that $a_i$ is equal to −1 and the probability that $a_i$ is equal to +1, these probabilities taking into account at least part of the extrinsic information calculations already made.

Thus the extrinsic information already calculated can be used iteratively.

According to a particular characteristic, the quantity $\rho(\alpha_i)$ is given by $\rho(\alpha_i)=\rho(\alpha_i) \cdot \rho_{ext}[A(i,h)]$ where $\rho(\alpha_i)=P(-1|\alpha_i)/P(+1|\alpha_i)$, $P(a_i|\alpha_i)$ designating the probability that the $i^{th}$ signal transmitted was $a_i$ if the $i^{th}$ signal received is $\alpha_i$.

According to a particular characteristic, the decoding method of the invention is implemented in a turbodecoding method.

This simplifies this turbodecoding method without weakening its effectiveness.

According to a particular characteristic, the calculations relating to the aforementioned recurrence are effected in multiple precision.

Thus the precision of the calculations is not affected by the calculation of the differences, which is inherent in the proposed decoding method.

For the same purpose as indicated above, the present invention also proposes a device for decoding a received sequence $\alpha=(\alpha_1, \ldots, \alpha_n)$ where, for any integer i between 1 and n, n being an integer greater than 1, $\alpha_i$ is the received electrical signal corresponding to the transmission of an electrical signal $a_i$ representing the $i^{th}$ binary element $v_i$ of a word chosen in a binary code C of words $v=(v_1, \ldots, v_n)$ satisfying $v \cdot h^T=0$, where h is a row n-tuplet on the set $\{0,1\}$ whose number of 1 is denoted w, where $^T$ represents the transposition and the scalar product $v \cdot h^T$ is calculated modulo 2, this decoding device having means for determining extrinsic information on each of the binary elements of v covered by h, the extrinsic information given on the $i^{th}$ binary element of v, assumed to be covered by h, being the quantity $\rho_{ext}[A(i,h)]=P[a_i=-1|A(i,h)]/P[a_i=+1|A(i,h)]$, where A(i,h) is the set of received values $\alpha_j$ of $\alpha$ which are covered by h, with the exception of $\alpha_i$, and where $P[a_i|A(i,h)]$ is the probability, calculated on the basis of the received signals $\alpha_j$ of A(i,h), that the $i^{th}$ signal transmitted was $a_i$, this decoding device being remarkable in that the determination of the extrinsic information is effected by means of the formula $$\rho_{ext}[A(i,h)]=[S_1(i)+S_3(i)+ \ldots ]/[1+S_2(i)+S_4(i)+ \ldots ]$$

where the numbers $S_r(i)$, for any integer r between 1 and w−1, are calculated by applying the recurrence $$r^{-1}\sum_{i=1}^{w} z^{\alpha_i}S_{r-1}(i) - z^{\alpha_j}S_{r-1}(j) = S_r(j)$$

to the numbers $S_0(i)$ initialised to 1, with $z=\exp(-4E/N)$, where E is the energy of the transmitted signals $a_i$ and N is the spectral power density of the noise on the transmission channel.

Thus the calculation of the quantities $\rho_{ext}[A(i,h)]$ requires a device whose complexity is only polynomial in the weight w of h.

In addition, the particular characteristics of the decoding device, which are not explained below, and their advantages, are similar to those of the decoding method and will therefore not be stated here.

In a particular embodiment, the device has:
  a plurality of multipliers, each of the multipliers receiving, at a first input, the value of $S_{r-1}(i)$ and, at its second input, the value $-z^{\alpha_i}$;
  a plurality of adders, a first input of each of the adders being respectively connected to the output of each of the multipliers;
  an adding module, whose input is connected to the output of each of the multipliers;
  an additional multiplication module, a first input of which is connected to the output of the adding module and the second input of which receives the value $-1/r$, the output of the additional multiplication module being connected to the second input of each of the adders; and
  a delay introduction module, whose input is connected to the output of each of the adders and whose output is connected to the first input of each of the multipliers, this device being initialised by $S_0(i)=1$ for any i, so that each of the adders outputs the value $S_r(i)$.

In a particular embodiment, several of the calculations necessary for determining the extrinsic information can be made by circuits put in parallel.

In another embodiment, several of the calculations necessary for determining the extrinsic information can be made by circuits put in series.

The present invention also relates to a digital signal processing apparatus, having means adapted to implement a decoding method as above.

The present invention also relates to a digital signal processing apparatus, having a decoding device as above.

The present invention also relates to a telecommunications network, having means adapted to implement a decoding method as above.

The present invention also relates to a telecommunications network, having a decoding device as above.

The present invention also relates to a mobile station in a telecommunications network, having means adapted to implement a decoding method as above.

The present invention also relates to a mobile station in a telecommunications network, having a decoding device as above.

The present invention also relates to a device for processing signals representing speech, including a decoding device as above.

The present invention also relates to a data transmission device having a transmitter adapted to implement a packet transmission protocol, having a decoding device and/or a device for processing signals representing speech as above.

According to a particular characteristic of the data transmission device, the packet transmission protocol is of the ATM (Asynchronous Transfer Mode) type.

As a variant, the packet transmission protocol is of the IP (Internet Protocol) type.

The invention also relates to:

an information storage means which can be read by a computer or microprocessor storing instructions of a computer program, making it possible to implement a decoding method as above, and an information storage means which is removable, partially or totally, and which can be read by a computer or microprocessor storing instructions of a computer program, making it possible to implement a decoding method as above. By way of non-limiting example, such a removable storage means may be a floppy disk or a CD-ROM or a DVD-ROM.

The invention also relates to a computer program containing sequences of instructions for implementing a decoding method as above.

The particular characteristics and the advantages of the different digital signal processing apparatus, the different telecommunications networks, the different mobile stations, the device for processing signals representing speech, the data transmission device, the information storage means and the computer program being similar to those of the decoding method according to the invention, they are not stated here.

Other aspects and advantages of the invention will emerge from a reading of the following detailed description of particular embodiments, given by way of non-limitative examples. The description refers to the drawings which accompany it, in which:

DETAIL DESCRIPTION OF THE PREFERRED EMBODIMENTS

Figure 1:
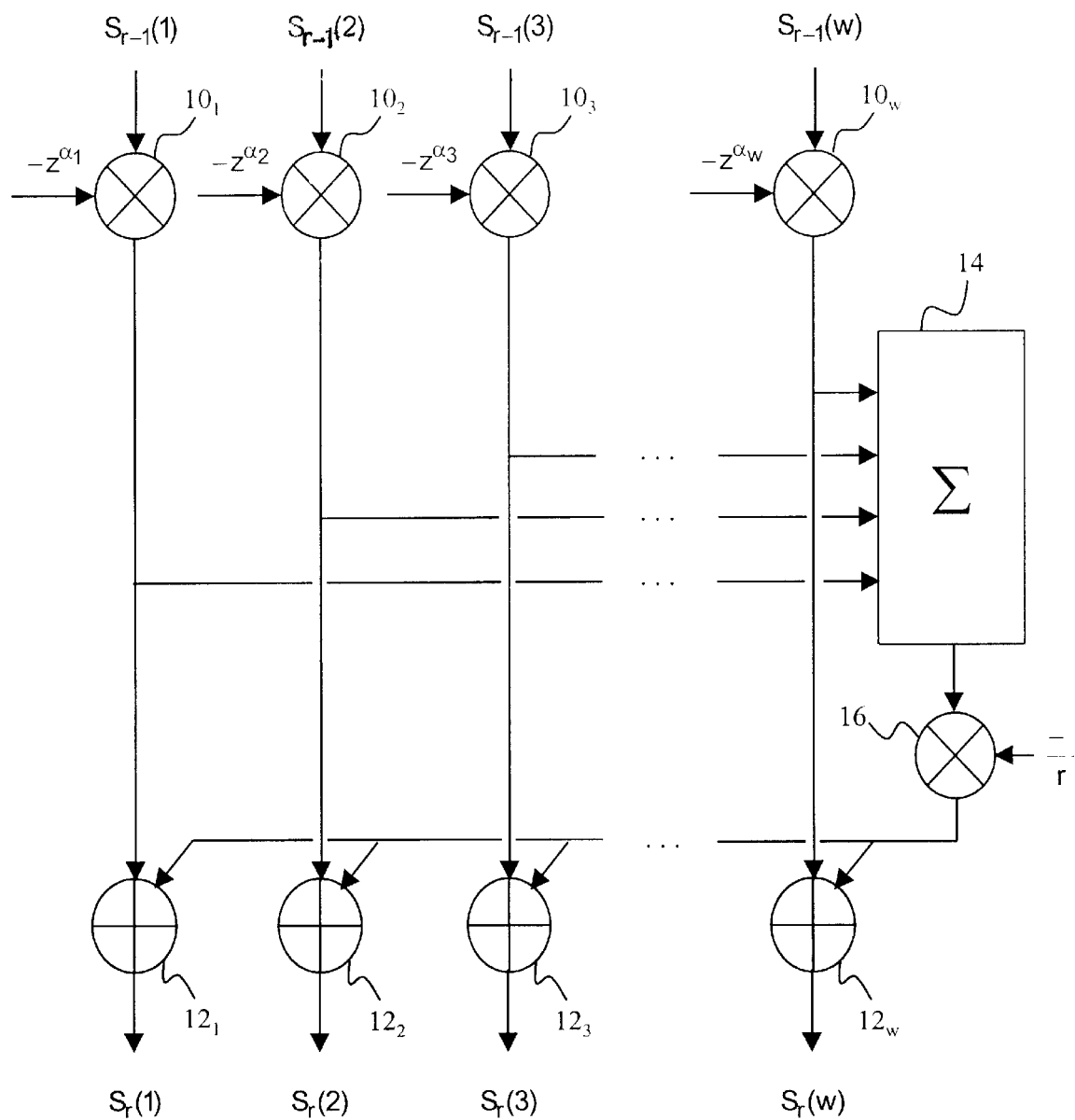
FIG. 1 depicts schematically a circuit for the simultaneous calculation of the quantities $S_r(j)$ using a decoding method according to the present invention, in a particular embodiment.

A received sequence $\alpha=(\alpha_1, \ldots, \alpha_n)$, which was passed through a transmission channel impaired by white Gaussian noise, is considered below.

For any integer i between 1 and n, n being an integer greater than 1, $\alpha_i$ is the received electrical signal corresponding to the transmission of an electrical signal $a_i$. The electrical signal $a_i$ represents the $i^{th}$ binary element $v_i$ of a word v chosen in a code C of words satisfying $v \cdot h^T = 0$, where h is a row n-tuplet of binary elements whose number of 1 is denoted w, where $^T$ represents the transposition and where the scalar product $v \cdot h^T$ is calculated modulo 2.

The decoding method of the invention includes a step consisting of determining extrinsic information on each of the binary elements $v_i$ of said to be covered by $h=(h_1, \ldots, h_n)$, that is to say for any i such that $h_i=1$. It is said in fact that the word h covers the position of index i of v if the binary element of h in position i is 1.

The method proposed will be illustrated by the example, in no way limitative, where $w=4$.

From the definitions given in the introduction, the following expressions arise:

$$S_1(1) = z^{\alpha_2} + z^{\alpha_3} + z^{\alpha_4},$$

$$S_1(2) = z^{\alpha_1} + z^{\alpha_3} + z^{\alpha_4},$$

$$S_1(3) = z^{\alpha_1} + z^{\alpha_2} + z^{\alpha_4},$$

$$S_1(4) = z^{\alpha_1} + z^{\alpha_2} + z^{\alpha_3},$$

$$S_2(1) = z^{\alpha_2+\alpha_3} + z^{\alpha_2+\alpha_4} + z^{\alpha_3+\alpha_4},$$

$$S_2(2) = z^{\alpha_1+\alpha_3} + z^{\alpha_1+\alpha_4} + z^{\alpha_3+\alpha_4},$$

$$S_2(3) = z^{\alpha_1+\alpha_2} + z^{\alpha_1+\alpha_4} + z^{\alpha_2+\alpha_4},$$

$$S_2(4) = z^{\alpha_1+\alpha_2} + z^{\alpha_1+\alpha_3} + z^{\alpha_2+\alpha_3},$$

$$S_3(1) = z^{\alpha_2+\alpha_3+\alpha_4},$$

$$S_3(2) = z^{\alpha_1+\alpha_3+\alpha_4},$$

$$S_3(3) = z^{\alpha_1+\alpha_2+\alpha_4},$$

$$S_3(4) = z^{\alpha_1+\alpha_2+\alpha_3}.$$

It can be checked that the above expressions satisfy the following equations:

$$\sum_{i=1}^{4} z^{\alpha_i} S_1(i) - 2z^{\alpha_j} S_1(j) = 2S_2(j),$$

$$\sum_{i=1}^{4} z^{\alpha_i} S_2(i) - 3z^{\alpha_j} S_2(j) = 3S_3(j).$$

These equations are particular cases of more general equations valid for any w. In fact let $S_0(i)=1$ for any i. For $r=1, \ldots, w-1$:

$$\sum_{i=1}^{w} z^{\alpha_i} S_{r-1}(i) = r \sum z^{\alpha_{j_1} + \ldots + \alpha_{j_r}}, \quad (3)$$

$$r z^{\alpha_j} S_{r-1}(j) = r \sum z^{\alpha_{j_1} + \ldots + \alpha_{j_{r-1}} + \alpha_j}, \quad (4)$$

where, in the right-hand member of equation (3), the sum relates to all the r-tuplets $(j_1, \ldots, j_r)$ of integers between 1 and w (including delimiters) and satisfying $j_1 < j_2 < \ldots < j_r$, and where, in the right-hand member of equation (4), the sum relates to all the (r−1)-tuplets $(j_1, \ldots, j_{r-1})$ of integers which are different and not equal to j, between 1 and w (including delimiters) and satisfying $j_1 < j_2 < \ldots < j_{r-1}$.

It is verified that the difference between the right-hand members of equations (3) and (4) is given by:

$$r\Sigma z^{\alpha_{j_1} + \ldots + \alpha_{j_r}} - r\Sigma z^{\alpha_{j_1} + \ldots + \alpha_{j_{r-1}} + \alpha_j} = rS_r(j),$$

from which:

$$r^{-1} \sum_{i=1}^{w} z^{\alpha_i} S_{r-1}(i) - z^{\alpha_j} S_{r-1}(j) = S_r(j).$$

The interpretation of the terms of this recurrence is as follows. The sum $$r^{-1} \sum_{i=1}^{w} z^{\alpha_i} S_{r-1}(i)$$

includes once and only once each monomial obtained as the product of r different factors $z^{\alpha_i}$. The term $z^{\alpha_j} S_{r-1}(j)$ includes once and only once each monomial obtained as the product of r different factors $z^{\alpha_i}$, under the constraint that the monomial $z^{\alpha_j}$ is a factor of each of these monomials. Consequently the difference between these two expressions is indeed the sum of all the monomials obtained as a product of r different factors $z^{\alpha_i}$ amongst which the monomial $z^{\alpha_j}$ does not appear, that is to say $S_r(j)$.

This recurrence makes it possible, for r>0, to determine all the $S_r(j)$ values for $j=1, \ldots, w$ as soon as all the $S_{r-1}(j)$ values are known for $j=1, \ldots, w$.

Given that the use of this recurrence entails the calculation of a difference, it is advantageous to make the calculations in multiple precision, in order to avoid the conventional problem of lack of precision in the result, which can be posed when this result is small compared with the terms whose difference is being calculated.

To this end, it is for example possible to represent the quantities manipulated by a number of binary elements twice as great as the minimum necessary.

The present invention lends itself particularly well to implantations of the "serial" or "parallel" type, using a very simple base circuit, illustrated in FIG. 1. This circuit is in fact adapted to the iterative calculation of the w·(w−1) values $S_r(i)$ for $i=1, \ldots, w$ and $r=1, \ldots, w-1$.

It has a series of multipliers $10_1, 10_2, 10_3, \ldots, 10_w$, each multiplier $10_i$ receiving, at a first input, the value of $S_{r-1}(i)$ and, at its second input, the value $-z^{\alpha_i}$.

The circuit also includes a series of adders $12_1, 12_2, 12_3, \ldots, 12_w$. The output of each multiplier $10_i$ is connected to a first input of the adder $12_i$.

The output of each multiplier $10_i$ is also connected to the input of a single adding module 14. The output of the adding module 14 is connected to a first input of a multiplier 16, which receives at its second input the value $-1/r$.

The output of the multiplier 16 is connected to the second input of each adder $12_i$.

Thus each adder $12_i$ outputs the value $S_r(i)$.

Figure 2:
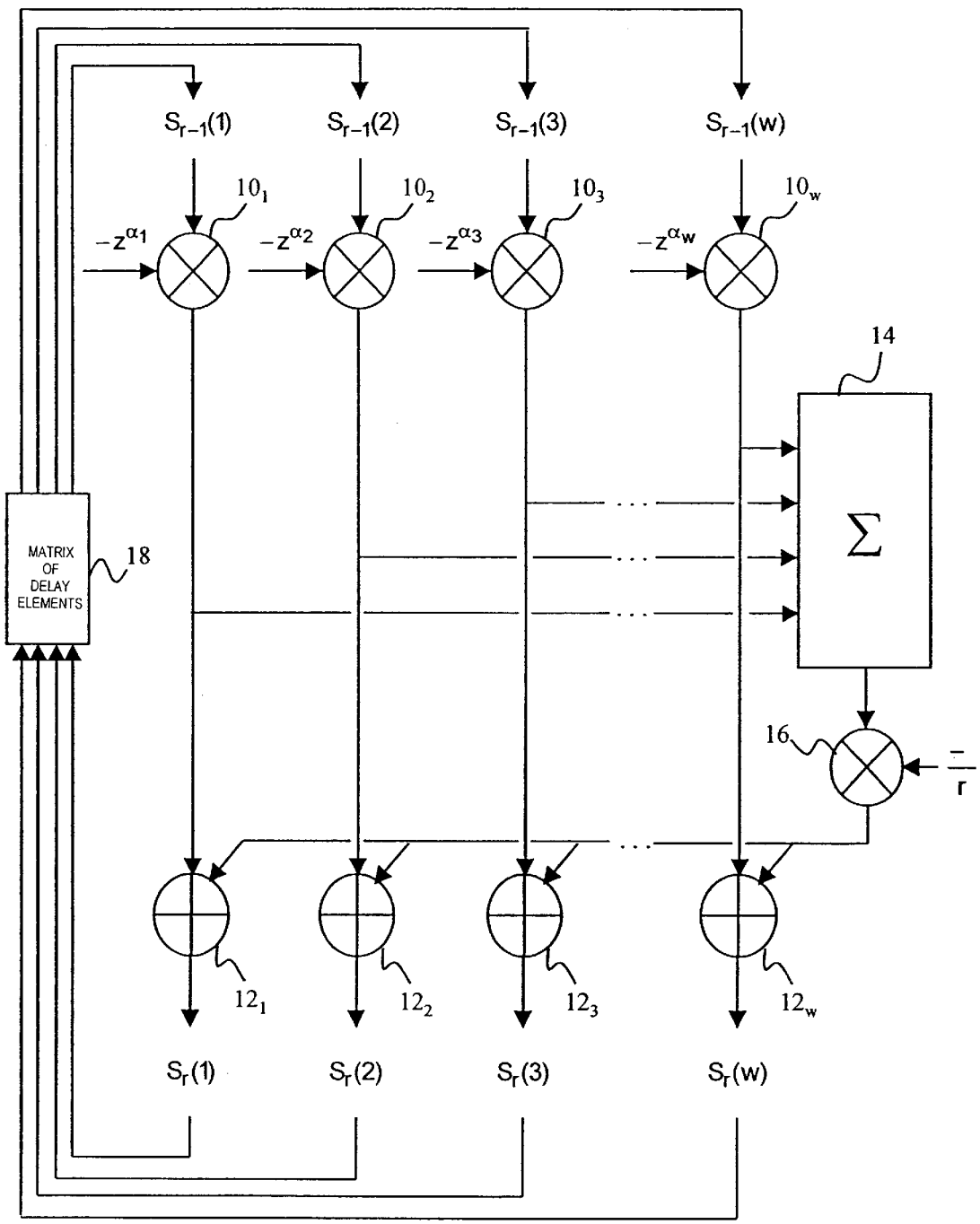
FIG. 2 depicts schematically a mode of iterative use of the circuit of FIG. 1.

It suffices to initialise the inputs of the circuit by $S_0(i)=1$ for any i. For r=1, the circuit calculates in one step all the values $S_1(i), i=1, \ldots, w$. Using these values $S_1(i)$ at the input of the circuit with r=2, the values $S_2(i)$ are obtained; by continuing in this way, the values $S_r(i)$ for any r are obtained. FIG. 2 illustrates schematically this iterative functioning mode.

FIG. 2 is identical to FIG. 1 and will therefore not be described again here, except that the outputs of the adders $12_1, 12_2, 12_3, \ldots, 12_w$ are respectively connected to the inputs of the multipliers $10_1, 10_2, 10_3, \ldots, 10_w$ by means of a matrix of delay elements 18, which makes it possible to use the recurrence giving the values $S_r(i)$ according to the values $S_{r-1}(i)$.

It is also possible to form a global circuit by disposing in cascade w−1 circuits like the one in FIG. 2 and initialising the first of them by $S_0(i)=1$ for any i. In this case, the w values $S_r(i), i=1, \ldots, w$ appear as outputs of the $r^{th}$ stage of the global circuit.

It is also possible to dispose a predetermined number of circuits like the one in FIG. 1 in parallel, in an iterative version (like the one in FIG. 2) or in cascade, in order to simultaneously calculate several different items of extrinsic information corresponding to parity relationships specified by different words h of the dual code $C^\perp$.

The invention has a particular application for turbodecoding.

In the above, the case of a transmission channel with white Gaussian noise was considered, along with the determination of extrinsic information obtained via one or more words h of the code $C^\perp$ orthogonal to the code C used for transmission.

However, after having determined, on the basis of one or more words h of $C^\perp$, one or more items of extrinsic information concerning the values of the transmitted symbols, it may be effective, as shown by recent works with regard to turbocodes (see for example the article by R. Pyndiah entitled "Near optimum decoding of product codes: block turbo codes", in IEEE Transactions on Communications, 46, No. 8, pages 1003 to 1010, August 1998), to calculate new items of extrinsic information, on the basis not only of the values $\rho(a)=P(-1|\alpha)/P(+1|\alpha)$, but on the basis of values $\rho(\alpha)$ taking into account all or part of the extrinsic information calculations already made. This remark is at the basis of the iterative decoding of error correcting codes. As indicated in the article by R. Pyndiah, the product codes lend themselves particularly well to this type of decoding. In particular, if, on the basis of one or more words h of $C^\perp$, quantities $\rho_{ext}[A(i,h)]$ have been calculated, it is possible to calculate new extrinsic information items, on the basis no longer only of the values $\rho(\alpha_i)=P(-1|\alpha_i)/P(+1|\alpha_i)$, but on the basis of the products $\rho(\alpha_i) \cdot \rho_{ext}[A(i,h)]$.

The circuit described above with the help of FIG. 1 can easily be used for this purpose. This is because, in this circuit, the $\rho(\alpha_i)$ values are represented by the parameters $z^{\alpha_i}$: this gives $\rho(\alpha_i)=z^{\alpha_i}$. Thus, if, at any time in the decoding, there is extrinsic information represented globally by new values $\rho(\alpha_i)$ of the values $\rho(\alpha_i)$, it suffices to replace in FIG. 1 the multiplicative coefficients $z^{\alpha_i}$ by these new coefficients $\rho(\alpha_i)$. The recurrence used is then $$r^{-1}\sum_{i=1}^{w}\underline{\rho}(\alpha_i)S_{r-1}(i)-\underline{\rho}(\alpha_j)S_{r-1}(j)=S_r(j)$$

where $\rho(\alpha_i)$ represents the ratio between the probability that $a_i$ is equal to $-1$ and the probability that $a_i$ is equal to $+1$.

Whatever the way in which the changes in the n values $\rho(\alpha_i)$ corresponding to the n binary elements $v_i$ transmitted, or, equivalently, to the n electrical signals as which represent them, are managed, the estimation of $a_i$ will be $-1$ if the final value of $\rho(\alpha_i)$ is strictly positive and will be $+1$ if the final value of $\rho(\alpha_i)$ is strictly negative.

Figure 3:
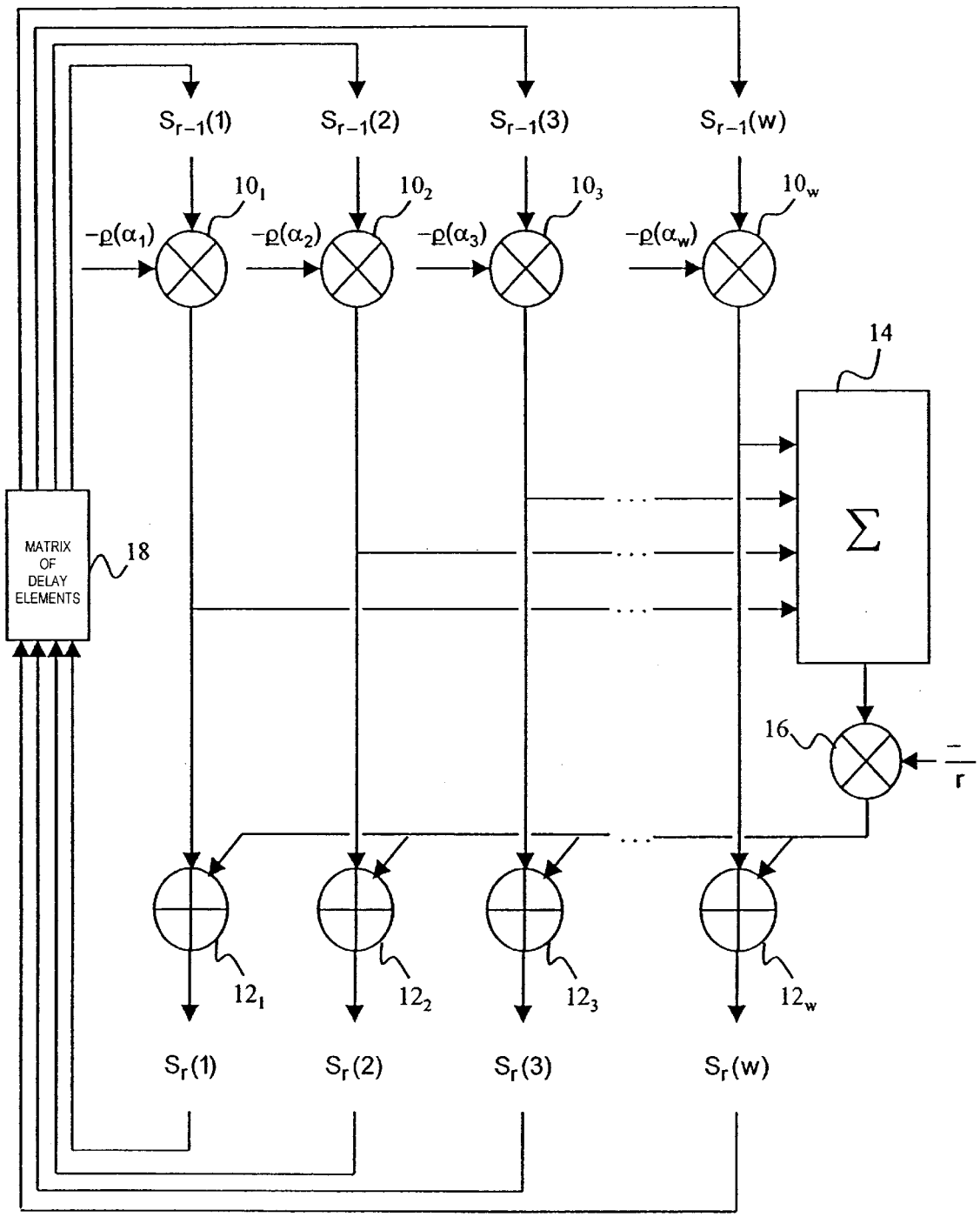
FIG. 3 depicts schematically a more general embodiment of the circuit for calculating the quantities $S_r(j)$, in which this calculation is made using information $\rho(\alpha,i)$ more general than the simple knowledge of the received symbols $\alpha_i$.

FIG. 3 depicts schematically this type of use of the circuit of FIG. 1, in the case of an implantation of the iterative type. It will not be described in any further detail given that the elements making up the circuit are the same and bear the same reference numbers as the elements already described with the help of FIGS. 1 and 2.

Figure 4:
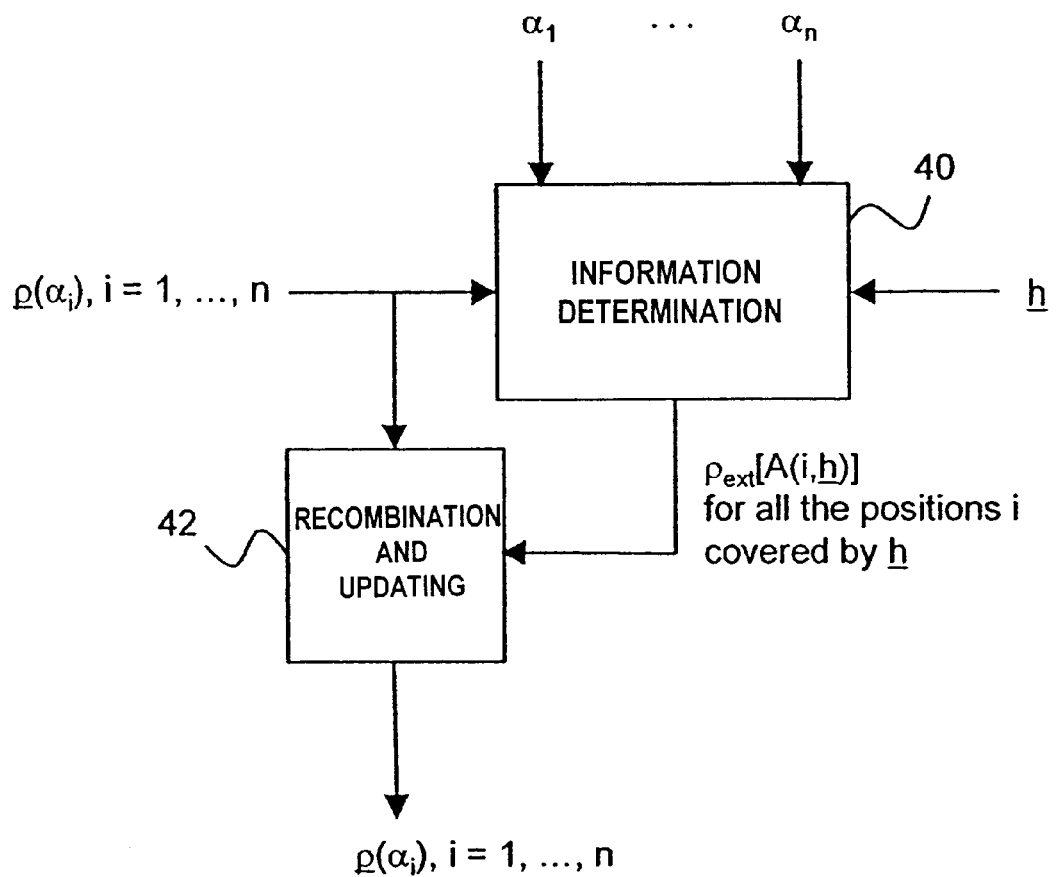
FIG. 4 illustrates schematically the application of the invention to the field of turbocodes, in a particular embodiment.

A use of the invention for decoding data using turbocodes is depicted schematically in FIG. 4. In order to simplify, the notations set out in the figure concern only one iteration of the decoding.

From the received sequence $(\alpha_i, \ldots, \alpha_n)$, from extrinsic information already calculated $\rho(\alpha_i)$ and from a word h of $C^{\perp}$, new extrinsic information $\rho_{ext}[A(i,h)]$ is calculated for all the positions i covered by h. This is illustrated by an extrinsic information determination block 40 in FIG. 4. Next this extrinsic information $\rho_{ext}[A(i,h)]$ is recombined with that already calculated $\rho(\alpha_i)$ in order to update this extrinsic information already calculated $\rho(\alpha_i)$. This is illustrated by a recombination and updating block 42.

Concerning the choice of the word h, by way of in no way limitative example, it will for example be possible to use one and the same word h in several non-consecutive iterations. Nevertheless, neither the optimisation of the choice of h, nor the mode of recombining the extrinsic information $\rho_{ext}[A(i,h)]$ with the information $\rho(\alpha_i)$, when the latter is updated, are within the scope of the present invention. These elements are therefore not described in detail here.

Figure 5:
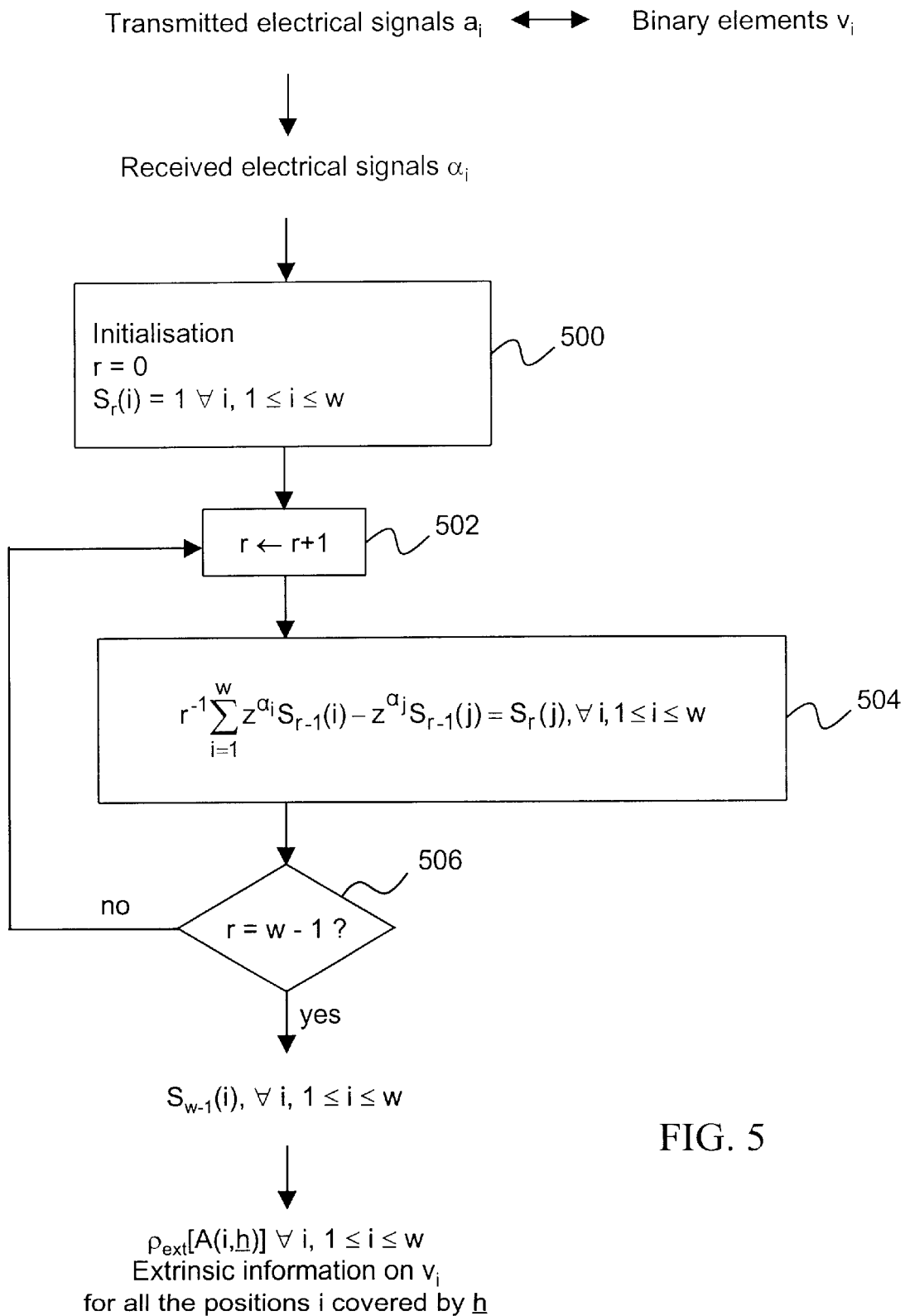
FIG. 5 is a flow diagram illustrating steps of a decoding method according to the present invention.

The flow diagram in FIG. 5 illustrates steps of a decoding method according to the present invention.

As shown in FIG. 5, it is assumed that electrical signals a representing respectively binary elements $v_i$ of a word v have previously been transmitted. As described above, the word v is chosen from a binary code C of words $v=(v_1, \ldots, v_n)$ satisfying $v \cdot h^T=0$, where h is a row n-tuplet on the set $\{0,1\}$ whose number of 1 is denoted w, where $^T$ represents the transposition and where the scalar product $v \cdot h^T$ is calculated modulo 2.

It is also assumed that a sequence $\alpha=(\alpha_1, \ldots, \alpha_n)$ of electrical signals has been received, where the received signal $\alpha_i$, $1 \leq i \leq n$ corresponds respectively to the transmitted signal $a_i$, $1 \leq i \leq n$.

A step 500 of initialising the decoding method according to the invention then consists of initialising a variable denoted r to the value 0 and initialising the quantities $S_r(i)$ defined above to the value 1 for any i between 1 and w, that is to say $S_0(i)=1 \forall i$, $1 \leq i \leq w$.

Then the recurrence on r is effected as follows:

an incrementation step 502 consists of increasing the value of r by one unit, an extrinsic information determination step 504 consists of obtaining $S_r(i)$ from the knowledge of $S_{r-1}(i)$, and this for all the values of i between 1 and w, as described above, and a test 506 consists of determining whether or not the value of r has reached the value w−1.

If test 506 is negative, steps 502, 504 and 506 are reiterated.

If test 506 is positive, this means that $r=w−1$; $S_{w-1}(i)$ has then been obtained for i between 1 and w.

As already described, for all the positions i covered by h and for all the values of i between 1 and w, there is then derived therefrom extrinsic information on $v_i$ denoted $\rho_{ext}[A(i,h)]$ and defined as being equal to $P[a_i=-1|A(i,h)]/P[a_i=+1|A(i,h)]$, where $A(i,h)$ is the set of the received values $\alpha_j$ of $\alpha$ which are covered by h, with the exception of $\alpha_i$, and where $P[a_i|A(i,h)]$ is the probability, calculated on the basis of the received signals $\alpha_j$ of $A(i,h)$, that the $i^{th}$ signal transmitted was $a_i$.

As described above, the extrinsic information is determined by means of the formula $$\rho_{ext}[A(i,h)]=[S_1(i)+S_3(i)+\ldots]/[1+S_2(i)+S_4(i)+\ldots]$$

where the numbers $S_r(i)$, for any integer r between 1 and w−1, are calculated by applying the recurrence $$r^{-1}\sum_{i=1}^{w}z^{\alpha_i}S_{r-1}(i)-z^{\alpha_j}S_{r-1}(j)=S_r(j)$$

to the numbers $S_0(i)$ initialised to 1, with $z=\exp(-4E/N)$, where E is the energy of the transmitted signals $a_i$ and N is the spectral power density of the noise on the transmission channel.

Figure 6:
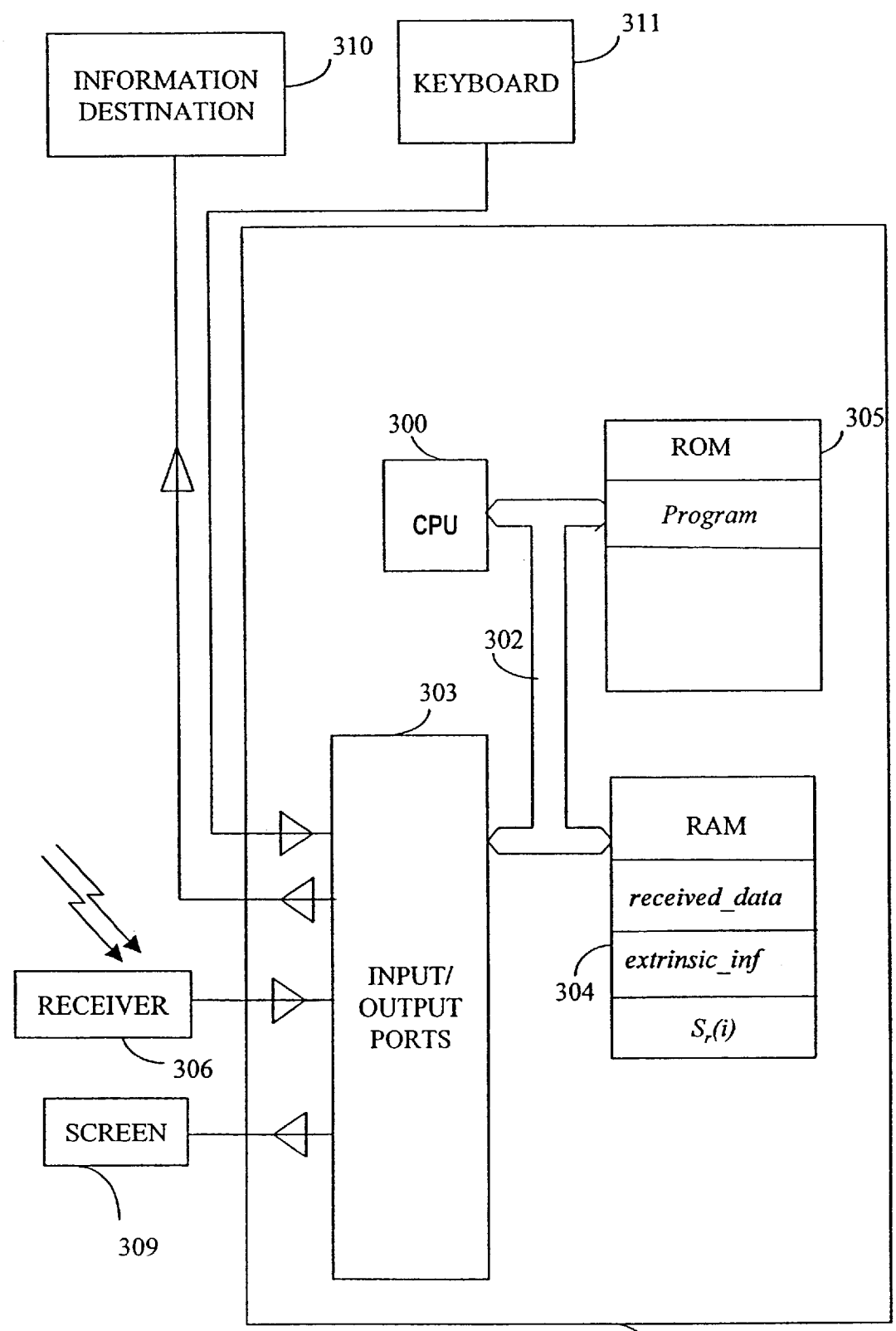
FIG. 6 depicts schematically an electronic device including a decoding device according to the present invention, in a particular embodiment.

FIG. 6 illustrates schematically the constitution of a network station or computer decoding station, in the form of a block diagram.

This station has a keyboard 311, a screen 309, an external information destination 310, and a radio receiver 306, conjointly connected to an input/output port 303 of a processing card 301.

The processing card 301 has, connected together by an address and data bus 302:

a central processing unit 300;

a random access memory RAM 304;

a read only memory ROM 305; and the input/output port 303.

Each of the elements illustrated in FIG. 6 is well known to a person skilled in the art of microcomputers and transmission systems and, more generally, information processing systems. These common elements are therefore not described here. It should however be noted that:

the information destination 310 is, for example, an interface peripheral, a display, a modulator, an external memory or other information processing system (not shown), and is advantageously adapted to receive sequences of signals representing speech, service messages or multimedia data, in the form of binary data sequences, and that the radio receiver 306 is adapted to implement a packet transmission protocol on a non-cabled channel, and to receive packets over such a channel.

It should also be noted that the word "register" used in the description designates, in each of the memories 304 and 305, both a memory area of low capacity (a few binary data) and a memory area of large capacity (making it possible to store an entire program).

The random access memory 304 stores data, variables and intermediate processing results, in memory registers bearing, in the description, the same names as the data whose values they store. The random access memory 304 contains notably:

a register "received_data", in which there are stored the binary data received, in their order of arrival on the bus 302 coming from the transmission channel, a register "extrinsic_inf", in which there are stored, at a given moment, the extrinsic information corresponding to each binary element $v_i$ of a word v, and a register "$S_r(i)$", in which there are stored the values of the numbers $S_r(i)$ as they are calculated.

The read only memory 305 is adapted to store the operating program of the central processing unit 300, in a register "Program".

The central processing unit 300 is adapted to implement the embodiments illustrated by FIGS. 1 to 3 and/or the application to the turbocodes illustrated by FIG. 4 and/or the flow diagram of FIG. 5.

As a variant, the invention could be implemented not only by software method but possibly by using hard-wired or programmable logic.

What is claimed is:

1. A method of decoding a received sequence $\alpha=(\alpha_1, \ldots, \alpha_n)$ where, for any integer i between 1 and n, n being an integer greater than 1, $\alpha_i$ is the received electrical signal corresponding to the transmission of an electrical signal $a_i$ representing the $i^{th}$ binary element $v_i$ of a word chosen in a binary code C of words $v=(v_1, \ldots, v_n)$ satisfying $v \cdot h^T = 0$, where h is a row n-tuplet on the set $\{0,1\}$ whose number of 1 is denoted w, where $^T$ represents the transposition and the scalar product $v \cdot h^T$ is calculated modulo 2, said decoding method including a step consisting of determining extrinsic information on each of the binary elements of v covered by h, said extrinsic information given on the $i^{th}$ binary element of v, assumed to be covered by h, being the quantity $$\rho_{ext}[A(i,h)] = P[a_i = -1 | A(i,h)] / P[a_i = +1 | A(i,h)],$$

where A(i,h) is the set of received values $\alpha_j$ of $\alpha$ which are covered by h, with the exception of $\alpha_i$, and where $P[a_i|A(i,h)]$ is the probability, calculated on the basis of the received signals $\alpha_j$ of A(i,h), that the $i^{th}$ signal transmitted was $a_i$, said decoding method being characterised in that the determination of the extrinsic information is effected by means of the formula $$\rho_{ext}[A(i,h)] = [S_1(i) + S_3(i) + \ldots] / [1 + S_2(i) + S_4(i) + \ldots]$$

where the numbers $S_r(i)$, for any integer r between 1 and w−1, are calculated by applying the recurrence $$r^{-1} \sum_{i=1}^{w} z^{\alpha_i} S_{r-1}(i) - z^{\alpha_j} S_{r-1}(j) = S_r(j)$$

to the numbers $S_0(i)$ initialised to 1, with z=exp(−4E/N), where E is the energy of the transmitted signals $a_i$ and N is the spectral power density of the noise on the transmission channel.

2. A method according to claim 1, wherein a supplementary item of extrinsic information is determined on each of the binary elements of v covered by h by applying the recurrence $$r^{-1} \sum_{i=1}^{w} \rho(\alpha_i) S_{r-1}(i) - \rho(\alpha_j) S_{r-1}(j) = S_r(j)$$

where $\rho(\alpha_i)$ represents the ratio between the probability that $a_i$ is equal to −1 and the probability that $a_i$ is equal to +1, these probabilities taking into account at least part of the extrinsic information calculations already made.

3. A method according to claim 2, wherein the quantity $\rho(\alpha_i)$ is given by $\rho(\alpha_i) = \rho(\alpha_i) \cdot \rho_{ext}[A(i,h)]$ where $\rho(\alpha_i) = P(-1|\alpha_i)/P(+1|\alpha_i)$, $P(a_i|\alpha_i)$ designated the probability that the $i^{th}$ signal transmitted was $a_i$ if the $i^{th}$ signal received is $\alpha_i$.

4. A method according to claim 1, 2 or 3, wherein it is implemented in a turbodecoding method.

5. A method according to 1, 2 or 3, wherein the calculations relating to said recurrence are made in multiple precision.

6. Digital signal processing apparatus, having means adapted to implement a decoding method according to claim 1, 2 or 3.

7. A telecommunications network, having means adapted to implement a decoding method according to claim 1, 2 or 3.

8. A mobile station in a telecommunications network, having means adapted to implement a decoding method according to claim 1, 2 or 3.

9. A device for decoding a received sequence $\alpha=(\alpha_1, \ldots, \alpha_n)$ where, for any integer i between 1 and n, n being an integer greater than 1, $\alpha_i$ is the received electrical signal corresponding to the transmission of an electrical signal $a_i$ representing the $i^{th}$ binary element $v_i$ of a word chosen in a binary code C of words $v=(v_1, \ldots, v_n)$ satisfying $v \cdot h^T = 0$, where h is a row n-tuplet on the set $\{0,1\}$ whose number of 1 is denoted w, where $^T$ represents the transposition and the scalar product $v \cdot h^T$ is calculated modulo 2, said decoding device having means for determining extrinsic information on each of the binary elements of v covered by h, said extrinsic information given on the $i^{th}$ binary element of v, assumed to be covered by h, being the quantity $$\rho_{ext}[A(i,h)] = P[a_i = -1|A(i,h)]/P[a_i = +1|A(i,h)],$$

where A(i,h) is the set of received values $\alpha_j$ of $\alpha$ which are covered by h, with the exception of $\alpha_i$, and where $P[a_i|A(i,h)]$ is the probability, calculated on the basis of the received signals $\alpha_j$ of A(i,h), that the $i^{th}$ signal transmitted was $a_i$, said decoding device being characterised in that the determination of the extrinsic information is effected by means of the formula $$\rho_{ext}[A(i,h)] = [S_1(i) + S_3(i) + \ldots]/[1 + S_2(i) + S_4(i) + \ldots]$$

where the numbers $S_r(i)$, for any integer r between 1 and w−1, are calculated by applying the recurrence $$r^{-1} \sum_{i=1}^{w} z^{\alpha_i} S_{r-1}(i) - z^{\alpha_j} S_{r-1}(j) = S_r(j)$$

to the numbers $S_0(i)$ initialised to 1, with z=exp(−4E/N), where E is the energy of the transmitted signals $a_i$ and N is the spectral power density of the noise on the transmission channel.

10. A device according to claim 9, further comprising means for determining an additional item of extrinsic information on each of the binary elements of v covered by h by applying the recurrence $$r^{-1}\sum_{i=1}^{w}\rho(\alpha_i)S_{r-1}(i) - \rho(\alpha_j)S_{r-1}(j) = S_r(j)$$

where $\rho(\alpha_i)$ represents the ratio between the probability that $a_i$ is equal to $-1$ and the probability that $a_i$ is equal to $+1$, these probabilities taking into account at least part of the extrinsic information calculations already made.

11. A device according to claim 10, wherein the quantity $\rho(\alpha_i)$ is given by $\rho(\alpha_i)=\rho(\alpha_i)\cdot\rho_{ext}[A(i,h)]$ where $\rho(\alpha_i)=P(-1|\alpha_i)/P(+1|\alpha_i)$, $P(a_i|\alpha_i)$ designating the probability that the $i^{th}$ signal transmitted was $a_i$ if the $i^{th}$ signal received is $\alpha_i$.

12. A device according to claim 9, 10 or 11, having:
   a plurality of multipliers, each of said multipliers receiving, at a first input, the value of $S_{r-1}(i)$ and, on its second input, the value $-Z^{\alpha_i}$;
   a plurality of adders, a first input of each of said adders being respectively connected to the output of each of said multipliers;
   adding means, whose input is connected to the output of each of said multipliers;
   additional multiplication means, a first input of which is connected to the output of said adding means and the second input of which receives the value $-1/r$, the output of said additional multiplication means being connected to the second input of each of said adders; and
   delay introduction means, whose input is connected to the output of each of said adders and whose output is connected to the first input of each of said multipliers, said device being initialised by $S_0(i)=1$ for any i, so that each of said adders outputs the value $S_r(i)$.

13. A device according to claim 9, 10 or 11, said device being used in a turbodecoder.

14. A device according to claim 9, 10 or 11, wherein the calculations relating to said recurrence are effected in multiple precision.

15. A device according to claim 9, 10 or 11, wherein the implementation of several of the calculations necessary for determining the extrinsic information is made by circuits put in parallel.

16. A device according to claim 9, 10 or 11, wherein the implementation of several of the calculations necessary for determining the extrinsic information is made by circuits put in series.

17. Digital signal processing apparatus, having a decoding device according to claim 9, 10, or 11.

18. A telecommunications network, having a decoding device according to claim 9, 10 or 11.

19. A mobile station in a telecommunications network, having a decoding device according to claim 9, 10 or 11.

20. A device for processing signals representing speech, including a decoding device according to claim 9, 10 or 11.

21. An information storage means which can be read by a computer or microprocessor, the storage means storing instructions of a computer program that, when implemented, causes the computer to execute a method of decoding a received sequence $\alpha=(\alpha_1, \ldots, \alpha_n)$ where, for any integer i between 1 and n, n being an integer greater than 1, $\alpha_i$ is the received electrical signal corresponding to the transmission of an electrical signal $a_i$ representing the $i^{th}$ binary element $v_i$ of a word chosen in a binary code C of words $v=(v_1, \ldots, v_n)$ satisfying $v \cdot h^T=0$, where h is a row n-tuplet on the set $\{0,1\}$ whose number of 1 is denoted w, where $^T$ represents the transposition and the scalar product $v \cdot h^T$ is calculated modulo 2, said decoding method including a step consisting of determining extrinsic information on each of the binary elements of v covered by h, said extrinsic information given on the $i^{th}$ binary element of v, assumed to be covered by h, being the quantity $$\rho_{ext}[A(i,h)]=P[a_i=-1|A(i,h)]/P[a_i=+1A(i,h)],$$

where A(i,h) is the set of received values $\alpha_j$ of $\alpha$ which are covered by h, with the exception of $\alpha_i$, and where $P[a_j|A(i,h)]$ is the probability, calculated on the basis of the received signals $\alpha_j$ of A(i,h), that the $i^{th}$ signal transmitted was $a_j$, said decoding method being characterized in that the determination of the extrinsic information is effected by means of the formula $$\rho_{ext}[A(i,h)]=[S_1(i)+S_3(i)+\ldots]/[1+S_2(i)+S_4(i)+\ldots]$$

where the numbers $S_r(i)$, for any integer r between 1 and $w-1$, are calculated by applying the recurrence $$r^{-1}\sum_{i=1}^{w}z^{\alpha_i}S_{r-1}(i) - z^{\alpha_j}S_{r-1}(j) = S_r(j)$$

to the numbers $S_0(i)$ initialised to 1, with $z=\exp(-4E/N)$, where E is the energy of the transmitted signals $a_i$ and N is the spectral power density of the noise on the transmission channel.

22. An information storage means according to claim 21, wherein the storage means is partially or totally removable.

23. An information storage means according to claim 22, wherein a supplementary item of extrinsic information is determined on each of the binary elements of v covered by h by applying the recurrence $$r^{-1}\sum_{i=1}^{w}\rho(\alpha_i)S_{r-1}(i) - \rho(\alpha_j)S_{r-1}(j) = S_r(j)$$

where $\rho(\alpha_i)$ represents the ratio between the probability that $a_i$ is equal to $-1$ and the probability that $a_i$ is equal to $+1$, these probabilities taking into account at least part of the extrinsic information calculations already made.

24. An information storage means according to claim 22, wherein the quantity $\rho(\alpha_i)$ is given by $\rho(\alpha_i)=\rho(\alpha_i)\cdot\rho_{ext}[A(i,h)]$ where $\rho(\alpha_i)=P(-1|\alpha_i)/P(+1|\alpha_i)$, $P(a_i|\alpha_i)$ designated the probability that the $i^{th}$ signal transmitted was $a_i$ if the $i^{th}$ signal received is $\alpha_i$.

* * * * *

UNITED STATES PATENT AND TRADEMARK OFFICE
CERTIFICATE OF CORRECTION

PATENT NO. : 6,910,006 B2  
APPLICATION NO. : 09/892874  
DATED : June 21, 2005  
INVENTOR(S) : Philippe Piret It is certified that error appears in the above-identified patent and that said Letters Patent is hereby corrected as shown below:

ON THE TITLE PAGE [57] ABSTRACT:

Abstract should read --In order to decode a sequence $\underline{\alpha}=(\alpha_1, \ldots, \alpha_i, \ldots, \alpha_n)$ where $\alpha_i$ is the received electrical signal corresponding to a transmitted signal $a_i$ representing the $i^{th}$ binary element $v_i$ of a word $\underline{v}=(v_1, \ldots, v_n)$ chosen in a code C of words satisfying $\underline{v}\cdot\underline{h}^T=0$, where $\underline{h}$ is a row n-tuplet on the set $\{0,1\}$, whose number of 1 is denoted w, an item of extrinsic information $\rho_{ext}[A(i,\underline{h})]=P[a_i=-1|A(i,\underline{h})]/P[a_i=+1|A(i,\underline{h})]$ is determined on each of the elements $v_i$ covered by $\underline{h}$, $A(i,\underline{h})$ being the set of the received values $\alpha_j$ covered by $\underline{h}$, with the exception of $\alpha_i$, and $P[a_i|A(i,\underline{h})]$ being the probability that the $i^{th}$ signal transmitted was $a_i$. This gives $\rho_{ext}[A(i,\underline{h})]=[S_1(i)+S_3(i)+ \ldots ]/[+S_2(i)+S_4(i)+ \ldots ]$ where the numbers $S_r(i)$ are calculated by applying the recurrence $$r^{-1}\sum_{i=1}^{w} z^{\alpha_i} S_r-1(i) - z^{\alpha_j} S_{r-1}(j) = S_r(j)$$

to the numbers $S_o(i)$ initialised to 1, with $z=\exp(-4\ E/N)$, where E is the energy of the transmitted signals $a_i$ and N is the spectral power density of the noise on the transmission channel.--.

COLUMN 1:

Line 29, "value a" should read --value $\alpha$--;  
Line 51, "words v" should read --words $\underline{v}$-- and  
"v·H$^T$=0," should read --$\underline{v}$·H$^T$=$\underline{0}$--;  
Line 52, "0 is" should read --$\underline{0}$ is--;  
Line 55, "v·H$^T$" should read --$\underline{v}$·H$^T$--;  
Line 57, "v·h$^T$=0," should read --$\underline{v}$·$\underline{h}^T$=0-- and  
"n-tuplet h" should read --n-tuplet $\underline{h}$--;  
Line 64, "words h" should read --words $\underline{h}$--; and  
Line 66, "word h" should read --word $\underline{h}$--.

COLUMN 2:

Line 4, "h:h=(1, . . . , 1," should read --$\underline{h}$:$\underline{h}$=(1, . . . , 1,--;  
Line 5, "v=(v$_1$, . . . , v$_n$)." should read --$\underline{v}$=(v$_1$, . . . , v$_n$).-- and  
"v·h$^T$=0," should read --$\underline{v}$·$\underline{h}^T$=0--;

UNITED STATES PATENT AND TRADEMARK OFFICE
CERTIFICATE OF CORRECTION

PATENT NO. : 6,910,006 B2
APPLICATION NO. : 09/892874
DATED : June 21, 2005
INVENTOR(S) : Philippe Piret It is certified that error appears in the above-identified patent and that said Letters Patent is hereby corrected as shown below:

COLUMN 2: (Continued)

Line 20, "a=(a$_1$, . . . , a$_n$)" should read --$\underline{a}$=(a$_1$, . . . , a$_n$)--;
Line 22, "n-tuplet v." should read --n-tuplet $\underline{v}$.-- and
"α=(α$_1$, . . . , α$_n$)" should read --$\underline{\alpha}$=(α$_1$, . . . , α$_n$)--;
Line 24, "given h," should read --given $\underline{h}$,--;
Line 26, "from α." should read --from $\underline{\alpha}$.--;
Line 28, "A(i, h)," should read --A(i, $\underline{h}$),--;
Line 30, "A(i, h)" should read --A(i, $\underline{h}$)--; and Lines 38-44, "
$$S_1(i) = \sum z^{\alpha_j}, \alpha_j \in A(i,h),$$
$$S_2(i) = \sum z^{\alpha_j+\alpha_k}, \alpha_j, \alpha_k \in A(i,h), j < k,$$
$$S_3(i) = \sum z^{\alpha_j+\alpha_k+\alpha_l}, \alpha_j, \alpha_k, \alpha_l \in A(i,h), j < k < l, \ldots$$
$$S_{w-1}(i) = z^{\alpha_1+\ldots+\alpha_{i-1}+\alpha_{i+1}+\ldots+\alpha_w}$$
"

should read

--
$$S_1(i) = \sum z^{\alpha_j}, \alpha_j \in A(i,\underline{h}),$$
$$S_2(i) = \sum z^{\alpha_j+\alpha_k}, \alpha_j, \alpha_k \in A(i,\underline{h}), j < k,$$
$$S_3(i) = \sum z^{\alpha_j+\alpha_k+\alpha_l}, \alpha_j, \alpha_k, \alpha_l \in A(j\ \underline{h}), j < k < l, \ldots$$
$$S_{w-1}(i) = z^{\alpha_1+\ldots+\alpha_{i-1}+\alpha_{i+1}+\ldots+\alpha_w}$$
--;

Line 46, "P[a$_i$|A(i,h)]" should read --P[a$_i$|A(i,$\underline{h}$)]--;
Line 47, "A(i,h)." should read --A(i,$\underline{h}$).--;
Line 48, "ρ$_{ext}$[A(i,h)]=P[a$_i$=-1|A(i,h)]/P[a$_i$=+1|A(i,h)]" should read
--ρ$_{ext}$[A(i,$\underline{h}$)]=P[a$_i$=-1|A(i,$\underline{h}$)]/P[a$_i$=+1|A(i,$\underline{h}$)]--;
Line 51, "ρ$_{ext}$[A(i,h)]" should read --ρ$_{ext}$[A(i,$\underline{h}$)]--;
Line 55, "ρ$_{ext}$[A(i,h)]=[S$_1$(i)+S$_3$(i)+ . . . ]/[1+S$_2$(i)+S$_4$(i)+ . . .]" should read
--ρ$_{ext}$[A(i,$\underline{h}$)]=[S$_1$(i)+S$_3$(i)+ . . . ]/[1+S$_2$(i)+S$_4$(i)+ . . .]--;
Line 59, "ρ$_{ext}$[A(i,h)]" should read --ρ$_{ext}$[A(i,$\underline{h}$)]--; and
Line 62, "word h" should read --word $\underline{h}$--.

UNITED STATES PATENT AND TRADEMARK OFFICE
CERTIFICATE OF CORRECTION

PATENT NO. : 6,910,006 B2
APPLICATION NO. : 09/892874
DATED : June 21, 2005
INVENTOR(S) : Philippe Piret It is certified that error appears in the above-identified patent and that said Letters Patent is hereby corrected as shown below:

COLUMN 3:

Line 2, "$\alpha=(\alpha_1, \ldots, \alpha_n)$" should read --$\underline{\alpha}=(\alpha_1, \ldots, \alpha_n)$--;
Line 6, "$v=(v_1, \ldots, v_n)$" should read --$\underline{v}=(v_1, \ldots, v_n)$-- and
"$v \cdot h^T=0$, where h" should read --$\underline{v} \cdot \underline{h}^T=0$, where $\underline{h}$--;
Line 9, "$v \cdot h^T$" should read --$\underline{v} \cdot \underline{h}^T$--;
Line 12, "of v" should read --of $\underline{v}$-- and "by h," should read --by $\underline{h}$,--;
Line 13, "of v," should read --of $\underline{v}$,--;
Line 14, "by h," should read --by $\underline{h}$,-- and
"$\rho_{ext}[A(i,h)]=P[a_i=-$" should read --$\rho_{ext}[A(i,\underline{h})]=P[a_i=-$ --;
Line 15, "$1|A(i,h)]/P[a_i=+1|A(i,h)],$" should read --$1|A(i,\underline{h})]/P[a_i=+1|A(i,\underline{h})],$--
and "$A(i,h)$" should read --$A(i,\underline{h})$--;
Line 16, "of $\alpha$" should read --of $\underline{\alpha}$-- and "by h," should read --by $\underline{h}$,--;
Line 17, "$P[a_i|A(i,h)]$" should read --$P[a_i|A(i,\underline{h})]$--;
Line 19, "$A(i,h),$" should read --$A(i,\underline{h}),$--;
Line 25, "$\rho_{ext}[A(i,h)]=[S_1(i)+S_3(i)+ \ldots ]/[1+S_2(i)+S_4(i)+ \ldots ]$" should read
--$\rho_{ext}[A(i,\underline{h})]=[S_1(i)+S_3(i)+ \ldots ]/[1+S_2(i)+S_4(i)+ \ldots ]$--;
Line 37, "word h" should read --word $\underline{h}$-- and "(of v," should read --(of $\underline{v}$,--;
Line 38, "a or $\alpha$)" should read --$\underline{a}$ or $\underline{\alpha}$)-- and "of h" should read --of $\underline{h}$--;
Line 40, "$\rho_{ext}[A(i,h)],$" should read --$\rho_{ext}[A(i,\underline{h})],$--;
Line 42, "of h." should read --of $\underline{h}$.--;
Line 45, "of v" should read --of $\underline{v}$-- and "by h" should read --by $\underline{h}$--;
Line 53, "$\rho(\alpha_i)$" should read --$\underline{\rho}(\alpha_i)$--;
Line 59, "$\rho(\alpha_i)$" should read --$\underline{\rho}(\alpha_i)$--; and
Line 60, "$\rho(\alpha_i)=\rho(\alpha_i) \cdot \rho_{ext}[A(i,h)]$" should read --$\underline{\rho}(\alpha_i)=\rho(\alpha_i) \cdot \rho_{ext}[A(i,\underline{h})]$--.

COLUMN 4:

Line 8, "$\alpha=(\alpha_1, \ldots, \alpha_n)$" should read --$\underline{\alpha}=(\alpha_1, \ldots, \alpha_n)$--;
Line 12, "$v=(v_1, \ldots, v_n)$" should read --$\underline{v}=(v_1, \ldots, v_n)$--;
Line 13, "$v \cdot h^T=0$, where h" should read --$\underline{v} \cdot \underline{h}^T=0$, where $\underline{h}$--;
Line 15, "$v \cdot h^T$" should read --$\underline{v} \cdot \underline{h}^T$--;
Line 19, "v covered by h," should read --$\underline{v}$ covered by $\underline{h}$--;
Line 20, "of v," should read --of $\underline{v}$,-- and "by h," should read --by $\underline{h}$,--;
Line 21, "$\rho_{ext}[A(i,h)]=P[a_i=-1|A(i,h)]/P[a_i=+$" should read
--$\rho_{ext}[A(i,\underline{h})]=P[a_i=-1|A(i,\underline{h})]/P[a_i=+$--;
Line 22, "$1|A(i,h)],$" should read --$1|A(i,\underline{h})],$-- and
"$A(i,h)$" should read --$A(i,\underline{h})$--;
Line 23, "of $\alpha$" should read --of $\underline{\alpha}$-- and "by h," should read --by $\underline{h}$,--;

UNITED STATES PATENT AND TRADEMARK OFFICE
CERTIFICATE OF CORRECTION

PATENT NO. : 6,910,006 B2
APPLICATION NO. : 09/892874
DATED : June 21, 2005
INVENTOR(S) : Philippe Piret It is certified that error appears in the above-identified patent and that said Letters Patent is hereby corrected as shown below:

Line 24, "$P[a_i|A(i,h)]$" should read --$P[a_i|A(i,\underline{h})]$--;
Line 25, "$A(i,h)$," should read --$A(i,\underline{h})$,--;
Line 31, "$\rho_{ext}[A(i,h)]=[S_1(i)+S_3(i)+ \ldots ]/[1+S_2(i)+S_4(i)+ \ldots]$" should read "$\rho_{ext}[A(i,\underline{h})]=[S_1(i)+S_3(i)+ \ldots ]/[1+S_2(i)+S_4(i)+ \ldots]$--; and
Line 43, "$\rho_{ext}[A(i,h)]$" should read --$\rho_{ext}[A(i,\underline{h})]$--.

COLUMN 6:

Line 20, "$\alpha=(\alpha_1, \ldots, \alpha_n)$," should read --$\underline{\alpha} =(\alpha_1, \ldots, \alpha_n)$,--;
Line 27, "word v" should read --word $\underline{v}$-- and "$v \cdot h^T=0$," should read --$\underline{v} \cdot \underline{h}^T=0$,--;
Line 28, "h is" should read --$\underline{h}$ is--;
Line 30, "$v \cdot h^T$" should read --$\underline{v} \cdot \underline{h}^T$--;
Line 34, "of said" should read --of $\underline{v}$ said-- and "$h=(h_1, \ldots,$" should read --$\underline{h}=(h_1, \ldots,$--;
Line 36, "word h" should read --word $\underline{h}$-- and "of v" should read --of $\underline{v}$--; and
Line 37, "of h" should read --of $\underline{h}$--.

COLUMN 8:

Line 40, "words h" should read --words $\underline{h}$--;
Line 46, 'words h" should read --words $\underline{h}$--;
Line 49, 'words h" should read --words $\underline{h}$--;
Line 56, "$\rho(a)=P(-1|\alpha)/P(+1|\alpha)$," should read --$\rho(\alpha)=P(-1|\alpha)/P(+1|\alpha)$,--;
Line 57, "$\rho(\alpha)$" should read --$\underline{\rho}(\alpha)$--;
Line 64, "words h" should read --words $\underline{h}$-- and "$\rho_{ext}[A(i,h)]$" should read --$\rho_{ext}[A(i,\underline{h})]$--; and
Line 67, "$\rho(\alpha_i) \cdot \rho_{ext}[A(i,h)]$." should read --$\underline{\rho}(\alpha_i)=\rho(\alpha_i) \cdot \rho_{ext}[A(i,\underline{h})]$.--.

COLUMN 9:

Line 6, "values $\rho(\alpha_i)$" should read --values $\underline{\rho}(\alpha_i)$--;
Line 8, "$\rho(\alpha_i)$." should read --$\underline{\rho}(\alpha_i)$.--;
Line 14, "$\rho(\alpha_i)$" should read --$\underline{\rho}(\alpha_i)$--;
Line 17, "$\rho(\alpha_i)$" should read --$\underline{\rho}(\alpha_i)$--;
Line 20, "$\rho(\alpha_i)$" should read --$\underline{\rho}(\alpha_i)$--;
Line 21, "$\rho(\alpha_i)$" should read --$\underline{\rho}(\alpha_i)$--;
Line 33, "$\rho(\alpha_i)$" should read --$\underline{\rho}(\alpha_i)$-- and "word h" should read --word $\underline{h}$--;
Line 34, "$\rho_{ext}[A(i,h)]$" should read --$\rho_{ext}[A(i,\underline{h})]$--;

UNITED STATES PATENT AND TRADEMARK OFFICE
CERTIFICATE OF CORRECTION

PATENT NO. : 6,910,006 B2
APPLICATION NO. : 09/892874
DATED : June 21, 2005
INVENTOR(S) : Philippe Piret It is certified that error appears in the above-identified patent and that said Letters Patent is hereby corrected as shown below:

COLUMN 9: (Continued)

Line 35, "by h." should read --by $\underline{h}$.--;
Line 37, "$\rho_{ext}[A(i,h)]$" should read --$\rho_{ext}[A(i,\underline{h})]$--;
Line 38, "$\rho(\alpha_i)$" should read --$\underline{\rho}(\alpha_i)$--;
Line 39, "$\rho(\alpha_i)$." should read --$\underline{\rho}(\alpha_i)$.--;
Line 41, "word h," should read --word $\underline{h}$,--;
Line 43, "word h" should read --word $\underline{h}$--;
Line 44, "of h," should read --of $\underline{h}$,--;
Line 46, "h)]" should read --$\underline{h}$)]-- and "$\rho(\alpha_i)$," should read --$\underline{\rho}(\alpha_i)$,--;
Line 52, "word v" should read --word $\underline{v}$--;
Line 54, "word v" should read --word $\underline{v}$--; and
Line 55, "$v=(v_1, \ldots, v_n)$" should read --$\underline{v}=(v_1, \ldots, v_n)$-- and
 "$v \cdot h^T=0$, where h" should read --$\underline{v} \cdot \underline{h}^T=0$, where $\underline{h}$--.

COLUMN 10:

Line 14, "by h" should read --by $\underline{h}$--;
Line 17, "$[A(i,h)]$" should read --$[A(i,\underline{h})]$-- and "$P[a_i=-1|A(i,h)]/P[a_i=+$" should read --$P[a_i=-1|A(i,\underline{h})]/P[a_i=+$--;
Line 18, "$1|A(i,h)]$," should read --$1|A(i,\underline{h})]$,-- and "$A(i,h)$" should read --$A(i,\underline{h})$--;
Line 19, "$\alpha$" should read --$\underline{\alpha}$-- and "by h," should read --by $\underline{h}$,--;
Line 20, "$P[a_i|A(i,h)]$" should read --$P[a_i|A(i,\underline{h})]$--;
Line 21, "$A(i,h)$," should read --$A(i,\underline{h})$,--; and
Line 26, "$\rho_{ext}[A(i,h)]=[S_1(i)+S_3(i)+\ldots]/[1+S_2(i)+S_4(i)+\ldots]$" should read --$\rho_{ext}[A(i,\underline{h})]=[S_1(i)+S_3(i)+\ldots]/[1+S_2(i)+S_4(i)+\ldots]$--.

COLUMN 11:

Line 31, "$\alpha=(\alpha_1, \ldots, \alpha_n)$" should read --$\underline{\alpha}=(\alpha_1, \ldots, \alpha_n)$--;
Line 35, "$v=(v_1, \ldots, v_n)$" should read --$\underline{v}=(v_1, \ldots, v_n)$--;
Line 36, "$v \cdot h^T=0$, where h" should read --$\underline{v} \cdot \underline{h}^T=0$, where $\underline{h}$--;
Line 39, "$v \cdot h^T$" should read --$\underline{v} \cdot \underline{h}^T$--;
Line 41, "of v" should read --of $\underline{v}$-- and "by h," should read --by $\underline{h}$,--;
Line 42, "of v," should read --of $\underline{v}$,-- and "by h," should read --by $\underline{h}$,--;
Line 45, "$\rho_{ext}[A(i,h)]=P[a_i=-1|A(i,h)]/P[a_i=+1|A(i,h)]$," should read --$\rho_{ext}[A(i,\underline{h})]=P[a_i=-1|A(i,\underline{h})]/P[a_i=+1|A(i,\underline{h})]$,--;
Line 46, "$A(i,h)$" should read --$A(i,\underline{h})$-- and "of $\alpha$" should read --of $\underline{\alpha}$--;
Line 47, "by h," should read --by $\underline{h}$,--;
Line 48, "h)]" should read --$\underline{h}$)]--;

UNITED STATES PATENT AND TRADEMARK OFFICE
CERTIFICATE OF CORRECTION

PATENT NO.      : 6,910,006 B2
APPLICATION NO. : 09/892874
DATED           : June 21, 2005
INVENTOR(S)     : Philippe Piret It is certified that error appears in the above-identified patent and that said Letters Patent is hereby corrected as shown below:

COLUMN 11: (Continued)

Line 49, "A(i,h)" should read --A(i,$\underline{h}$),--; and
    Line 53, "$\rho_{ext}[A(i,h)]=[S_1(i)+S_3(i)+ \ldots ]/[1+S_2(i)+S_4(i)+ \ldots]$" should read
        --$\underline{\rho}_{ext}[A(i,\underline{h})]=[S_1(i)+S_3(i)+ \ldots ]/[1+S_2(i)+S_4(i)+ \ldots]$--.

COLUMN 12:

Line 1, "of v" should read --of $\underline{v}$-- and "by h" should read --by $\underline{h}$--;
    Line 8, "where $\rho(\alpha_i)$" should read --$\underline{\rho}(\alpha_i)$--;
    Line 13, "$\rho(\alpha_i)=\rho(\alpha_i) \cdot \rho_{ext}[A(i,h)]$" should read --$\underline{\rho}(\alpha_i)=\rho(\alpha_i) \cdot \rho_{ext}[A(i,\underline{h})]$--;
    Line 31, "$\alpha=(\alpha_1, \ldots, \alpha_n)$" should read --$\underline{\alpha}=(\alpha_1, \ldots, \alpha_n)$--;
    Line 35, "$v=(v_1, \ldots, v_n)$" should read --$\underline{v}=(v_1, \ldots, v_n)$--;
    Line 36, "$v \cdot h^T=0$, where h" should read --$\underline{v} \cdot \underline{h}^T=0$, where $\underline{h}$--;
    Line 38, "$v \cdot h^T$" should read --$\underline{v} \cdot \underline{h}^T$--;
    Line 40, "of v" should read --of $\underline{v}$--;
    Line 41, "h," should read --$\underline{h}$,--;
    Line 42, "of v," should read --of $\underline{v}$,-- and "by h," should read --by $\underline{h}$,--;
    Line 44, "$\rho_{ext}[A(i,h)]P[a_i=-1|A(i,h)]/P[a_i=+1|A(i,h)]$," should read
        --$\underline{\rho}_{ext}[A(i,\underline{h})]=P[a_i=-1|A(i,\underline{h})]/P[a_i=+1|A(i,\underline{h})]$,--;
    Line 45, "A(i,h)" should read --A(i,$\underline{h}$)-- and "of $\alpha$" should read --of $\underline{\alpha}$--;
    Line 46, "by h," should read --by $\underline{h}$,--;
    Line 47, "h)]" should read --$\underline{h}$)]--;
    Line 48, "A(i,h)," should read --A(i,$\underline{h}$),--; and
    Line 53, "$\rho_{ext}[A(i,h)]=[S_1(i)+S_3(i)+ \ldots ]/[1+S_2(i)+S_4(i)+ \ldots]$" should read
        --$\underline{\rho}_{ext}[A(i,\underline{h})]=[S_1(i)+S_3(i)+ \ldots ]/[1+S_2(i)+S_4(i)+ \ldots]$--.

COLUMN 13:

Line 1, "of v" should read --of $\underline{v}$-- and "by h" should read --by $\underline{h}$--;
    Line 8, "$\rho(\alpha_i)$" should read --$\underline{\rho}(\alpha_i)$--; and
    Line 13, "$\rho(\alpha_i)$" should read --$\underline{\rho}(\alpha_i)$-- and "$\rho(\alpha_i)=\rho(\alpha_i) \cdot \rho_{ext}[A(i,h)]$" should read
        --$\underline{\rho}(\alpha_i)=\rho(\alpha_i) \cdot \rho_{ext}[A(i,\underline{h})]$--.

COLUMN 14:

Line 2, "$\alpha=(\alpha_1, \ldots, \alpha_n)$" should read --$\underline{\alpha}=(\alpha_1, \ldots, \alpha_n)$--;
    Line 7, "$v=(v_1, \ldots, v_n)$" should read --$\underline{v}=(v_1, \ldots, v_n)$-- and "$v \cdot h^T=0$, where h"
        should read --$\underline{v} \cdot \underline{h}^T=0$, where $\underline{h}$--;
    Line 9, "$v \cdot h^T$" should read --$\underline{v} \cdot \underline{h}^T$--;

UNITED STATES PATENT AND TRADEMARK OFFICE
CERTIFICATE OF CORRECTION

PATENT NO. : 6,910,006 B2
APPLICATION NO. : 09/892874
DATED : June 21, 2005
INVENTOR(S) : Philippe Piret It is certified that error appears in the above-identified patent and that said Letters Patent is hereby corrected as shown below:

COLUMN 14: (Continued)

Line 12, "of v" should read --of $\underline{v}$-- and "by h," should read --by $\underline{h}$,--;
Line 13, "of v," should read --of $\underline{v}$,--;
Line 14, "by h," should read --by $\underline{h}$,--;
Line 15, "$\rho_{ext}[A(i,h)]=P[a_i=-1|A(i,h)]/P[a_i=+1A(i,h)],$" should read
--$\rho_{ext}[A(i,\underline{h})]=P[a_i=-1|A(i,\underline{h})]/Pa_i=+1|A(i,\underline{h})],$--;
Line 17, "A(i,h)" should read --A(i,$\underline{h}$)-- and "of α" should read --of $\underline{\alpha}$--;
Line 18, "by h," should read --by $\underline{h}$--;
Line 19, "h)]" should read --$\underline{h}$)]--;
Line 20, "A(i,h)" should read --A(i,$\underline{h}$)--;
Line 25, "$\rho_{ext}[A(i,h)]=[S_1(i)+S_3(i)+\ldots]/[1+S_2(i)+S_4(i)+\ldots]$" should read
--$\rho_{ext}[A(i,\underline{h})]=[S_1(i)+S_3(i)+\ldots]/[1+S_2(i)+S_4(i)+\ldots]$--;
Line 49, "ρ(α_i)" should read --$\underline{\rho}(\alpha_i)$--;
Line 54, "ρ(α_i)" should read --$\underline{\rho}(\alpha_i)$-- and "ρ(α_i)=ρ(α_i)·ρ_{ext}[A(i," should read
--$\underline{\rho}(\alpha_i)=\rho(\alpha_i)\cdot\rho_{ext}[A(i,$--; and
Line 55, "h)]" should read --$\underline{h}$)]--.

Signed and Sealed this

Third Day of March, 2009

JOHN DOLL
*Acting Director of the United States Patent and Trademark Office*